United States Patent [19]
Mishra et al.

[11] Patent Number: 5,872,031
[45] Date of Patent: Feb. 16, 1999

[54] ENHANCEMENT-DEPLETION LOGIC BASED ON GAAS MOSFETS

[75] Inventors: Umesh Kumar Mishra, Santa Barbara; Primit A. Parikh, Goleta, both of Calif.

[73] Assignee: The Regents of the University of California, Oakland, Calif.

[21] Appl. No.: 757,875

[22] Filed: Nov. 27, 1996

[51] Int. Cl.$^6$ .................... M01L 21/8238; M01L 21/336
[52] U.S. Cl. ........................ 438/216; 438/285; 438/308
[58] Field of Search .................. 437/237, 12; 438/476, 438/216, 285, 308; 148/DIG. 163, DIG. 166

[56] References Cited

U.S. PATENT DOCUMENTS

| | | | |
|---|---|---|---|
| 4,144,634 | 3/1979 | Chang | 438/590 |
| 4,246,296 | 1/1981 | Chang | 437/17 |
| 4,578,127 | 3/1986 | Gossard | 117/95 |
| 4,729,000 | 3/1988 | Abrokwah | 257/195 |
| 5,036,374 | 7/1991 | Shimbo | 257/192 |
| 5,262,360 | 11/1993 | Holonyak, Jr. et al. . | |
| 5,327,448 | 7/1994 | Holonyak, Jr. et al. . | |
| 5,353,295 | 10/1994 | Holonyak, Jr. et al. . | |
| 5,373,522 | 12/1994 | Holonyak, Jr. et al. . | |
| 5,403,775 | 4/1995 | Holonyak, Jr. et al. . | |
| 5,425,043 | 6/1995 | Holonyak, Jr. et al. . | |

FOREIGN PATENT DOCUMENTS

WO 80/00521   3/1980   WIPO .

OTHER PUBLICATIONS

P.A. Parikh, et al., "Hydrogenation of GaAs MISFETs with Al203 as the gate insulator," Electronics Letters vol. 32, No. 18, pp. 1724–1726 (Aug. 1, 1996).

*Primary Examiner*—John Niebling
*Assistant Examiner*—Michael S. Lebentritt
*Attorney, Agent, or Firm*—Merchant, Gould, Smith, Edell, Welter & Schmidt

[57] ABSTRACT

The present invention discloses a method of forming an oxide layer on a layer of gallium arsenide, including the steps of depositing a layer of aluminum arsenide on the layer of gallium arsenide, of exposing the layer of aluminum arsenide to an oxidizing gas mixture so that the aluminum arsenide is oxidized to aluminum oxide, and of controlling excess arsenic released in the aluminum oxide during the exposing step, so as to ensure enhanced electrical properties in the aluminum oxide. The method is used to provide an insulating gate layer for a GaAs field effect transistor by forming an oxide layer on GaAs and controlling excess arsenic so as to maintain high resistivity in the oxide layer and to avoid the formation of interface surface states which degrade transistor performance. The method is also used to provide complementary metal-insulator-semiconductor logic devices based on the gallium arsenide field effect transistor.

25 Claims, 12 Drawing Sheets

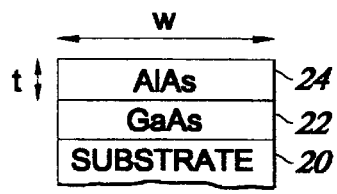
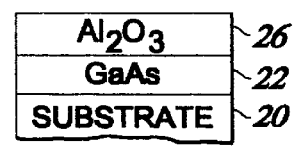
Fig. 1a                    Fig. 1b
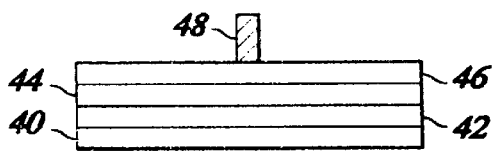
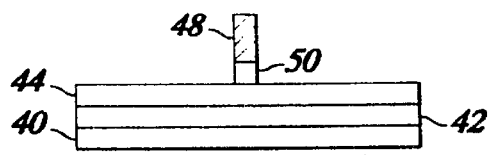
Fig. 2a                    Fig. 2b
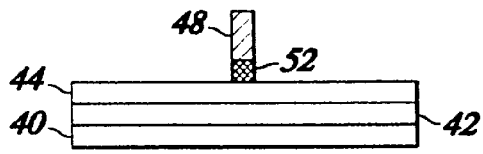
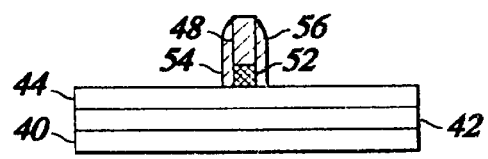
Fig. 2c                    Fig. 2d

ENHANCEMENT-DEPLETION LOGIC BASED ON GAAS MOSFETS

STATEMENT AS TO RIGHTS TO INVENTIONS MADE UNDER FEDERALLY SPONSORED RESEARCH AND DEVELOPMENT

This invention was made with Government support under Grant No. F49620-95-1-0394, awarded by the U.S. Air Force. The Government has certain rights in this invention.

CROSS-REFERENCE TO RELATED APPLICATIONS

This application is related to applications entitled: "Ultra-Low Phase Noise GaAs MOSFETs", Ser. No. 08/758,240 filed on Nov. 27, 1996 now U.S. Pat. No. 5,747,838; application entitled "Enhancement-Depletion Logic Based on Ge MOSFETs", Ser. No. 08/758,415 filed on Nov. 27, 1996, now abandoned; and application entitled "Ultra-Low Phase Noise Ge MOSFETs", Ser. No. 08/758,281 filed on Nov. 27, 1996, now U.S. Pat. No. 5,780,323; which related applications are incorporated by reference herein.

BACKGROUND OF THE INVENTION

1. Field of the Invention

This invention relates in general to semiconductor devices, and in particular to gallium arsenide field effect transistors and related devices.

2. Description of the Related Art

Silicon logic chips and logic families, for example transistor-transistor logic (TTL) and complementary metal-oxide-semiconductor (CMOS), have dominated the digital logic field of electronics for many years. Silicon is widely favored as a base material for semiconductor logic devices because of the ability to produce both semiconducting material (silicon) and insulating material (silicon oxide) with good electrical and mechanical properties. This combination of high quality semiconducting and insulating silicon-based materials has allowed the widespread implementation of planar growth and fabrication technologies, leading to the production of large scale integrated circuits. Therefore, silicon-based logic families include devices which are easily fabricated and are inexpensive to produce, and have gained wide acceptance. However, silicon-based devices are limited in speed and frequency bandwidth due to a relatively low carrier mobility. Materials having higher carrier mobility are preferable to silicon for many applications, and the implementation of such materials would result in the production of semiconductor devices which are faster and have a larger bandwidth than those currently fabricated using silicon.

Several alternative materials have been used to create new devices previously unavailable in silicon. One of these new materials, gallium arsenide (GaAs) is common in high frequency devices, high power microwave devices and in optoelectronic devices. However, even although gallium arsenide is widely regarded as being a superior material to silicon, because inter alia of a higher carrier mobility and higher breakdown field, GaAs has captured only a small fraction of the semiconductor device market share. The use of GaAs has been limited, in part, because it has not been possible to grow an insulating layer, such as an oxide layer, on GaAs, where the insulating layer has good electrical and mechanical properties. This has, therefore, restricted the large scale integration of GaAs using planar fabrication technologies. Consequently, reliable, high quality gallium arsenide metal-oxide-semiconductor (MOS) field effect transistors (FETs) have not been widely available. This has forced designers of digital circuits and devices to maintain the use of silicon for many applications.

A new technique has recently been developed (U.S. Pat. No. 5,262,360) for forming an oxide layer in a GaAs-based heterostructure and superlattice devices. The technique includes depositing a layer of aluminum arsenide (AlAs) where an oxide layer is desired, heating the substrate to a temperature in excess of 375° C., and exposing the AlAs layer to a mixture of $N_2$ gas and water vapor. At least partial oxidation of the AlAs layer takes place, producing one or more of the following: $Al(OH)_3$, $AlO(OH)$ or $A_2O_3$. The motivation for fabricating the oxide layer in the GaAs-based device was primarily to obtain an insulating layer with a low refractive index, which is advantageous for producing waveguide layers in optical devices, such as laser diodes. The electrical properties of the oxide layers thus formed have not been examined nor optimized, and their suitability for use as gate oxide layers in logic devices untested.

There is therefore a need to develop techniques of fabricating insulating layers, such as oxide layers, on GaAs-based semiconductor devices, in order that high speed, wide bandwidth semiconductor logic families become manufacturable. In addition, the insulating layers should have electrical and mechanical properties commensurate with use in planar fabrication technologies, including a high resistivity and only a nominal effects on the electrical properties of adjacent semiconductor layers. The successful implementation of an insulating layer compatible with GaAs-based semiconductor devices will lead to the production of faster, wider bandwidth circuits.

SUMMARY OF THE INVENTION

To minimize the limitations in the prior art described above, and to minimize other limitations that will become apparent upon reading and understanding the present specification, the present invention discloses a method of forming an oxide layer on a layer of gallium arsenide, including the steps of depositing a layer of aluminum arsenide on the layer of gallium arsenide, of exposing the layer of aluminum arsenide to an oxidizing gas mixture so that the aluminum arsenide is oxidized to aluminum oxide, and of controlling excess arsenic released in the aluminum oxide released in the exposing step, so as to ensure enhanced electrical properties in the aluminum oxide.

An object of the invention is to provide an insulating gate layer for a GaAs field effect transistor by forming an oxide layer on GaAs and controlling excess arsenic so as to maintain high resistivity in the oxide layer and to avoid the formation of interface surface states which degrade transistor performance.

Another object of the invention is to provide a complementary metal-insulator-semiconductor logic device based on gallium arsenide field effect devices.

BRIEF DESCRIPTION OF THE DRAWINGS

Referring now to the drawings in which like reference numbers represent corresponding parts throughout:

FIGS. 1A–1B illustrate oxidation of an AlAs layer according to the present invention;

FIGS. 2A–2J illustrate various fabrication stages of a field effect transistor;

FIGS. 6A–6D illustrate embodiments of a GaAs-based device adapted to control excess As;

FIG. 16 illustrates a GaAs CMIS device according to the second embodiment for controlling excess As; and FIG. 17 illustrates a GaAs CMIS device according to the third embodiment for controlling excess As.

DETAILED DESCRIPTION OF THE PREFERRED EMBODIMENTS

Figure 2E:
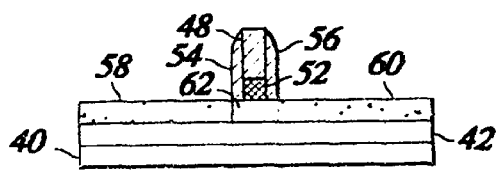

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.
Formation of Oxide Layer The process of the formation of an oxide layer on top of a layer of gallium arsenide (GaAs) is illustrated in FIGS. 1A and 1B. A substrate 20 is used as a base. The substrate 20 is typically of GaAs, but may also be of other materials. A layer of GaAs 22 is formed on a surface of the substrate 20. A layer of aluminum arsenide (AlAs) 24 is then formed on the GaAs layer 22, FIG. 1A, preferably using an epitaxial method growth process such as molecular beam epitaxy (MBE) or metal-organic chemical vapor deposition (MOCVD). AlAs is selected as the material for the second layer 24 because AlAs is lattice-matched to GaAs and also because AlAs may be converted into an insulating layer in a subsequent step. Since the AlAs material is to be oxidized at a later stage, it may be referred to as an oxidizable layer. Other aluminum-based III–V semiconductor materials having a different anion (Group V atom) may be used in the oxidizable layer instead of AlAs, for example aluminum phosphide (AlP) or aluminum antimonide (AlSb). These other materials are also oxidizable to form $Al_2O_3$.

The layered structure including the AlAs layer 24 is heated to a temperature in excess of 375° C. and exposed to a mixture of nitrogen ($N_2$) gas and water vapor ($H_2O$), as disclosed in U.S. Pat. No. 5,262,360. The gas/vapor mixture is formed by bubbling $N_2$ gas through water at a temperature close to boiling, for example 95° C. The AlAs layer is oxidized according to the reaction:

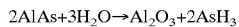

$$2AlAs + 3H_2O \rightarrow Al_2O_3 + 2AsH_3$$

The oxygen in the water molecules of the vapor displaces the arsenic in the AlAs, converting the AlAs layer to an aluminum oxide layer ($Al_2O_3$) 26, as is shown in FIG. 1B. As is released from Al in the oxidizable layer and combines with hydrogen to form arsine ($AsH_3$) as a byproduct of the oxidation process. The arsine is transported away from the surface by unreacted water vapor and the $N_2$ carrier gas. This oxidation process is termed "wet oxidation".

Two distinct processes are important in oxidation of an Al-bearing III–V layer. First, oxygen replaces the anion (group V element), to oxidize the cation (group III metal). For example, in the case of oxidizing a layer of aluminum arsenide (AlAs), Al is oxidized to become $Al_2O_3$. Therefore, the oxidizing gas should contain oxygen which is available for oxidizing the metal. Second, the group V cation, As, is removed from the oxide layer. In wet oxidation, the As is reduced by the addition of hydrogen to form $AsH_3$ gas, which escapes from the oxide layer. The amount of hydrogen available for binding with As is limited to that amount of hydrogen released by oxygen from the water vapor. In addition, some of the hydrogen may be bound up in the production of $Al(OH)_3$ or $AlO(OH)$. It has been found that the amount of hydrogen released from the water vapor is insufficient to bind with all the As released in oxidation, resulting in significant excess As within the oxide layer after oxidization. The excess As, the interstitial As left within the layer as a result of oxidation, including exposure to water vapor, has a deleterious effect on the underlying GaAs layer due to the formation of surface states at the interface between the oxide and the GaAs layer. The surface As states produce a mid-level (EL-2) impurity in the GaAs layer.

The process of oxidation need not be restricted to exposing the oxidizable layer to a mixture of $N_2$ and $H_2O$, but may also be carried out by using other gas mixtures. For example, oxygen may be provided for the oxidation step by oxygen-bearing molecules (oxidants) other than water, such as oxygen, ozone, carbon dioxide, carbon monoxide, and nitrous oxide.

Likewise, hydrogen may be provided for reducing the interstitial As to arsine by hydrogen-bearing molecules (reducing agents) other than water, such as hydrogen, deuterium, arsine, phosphine, ammonia, antimony hydride, and diethylarsine hydride. These alternative reducing agents may be cracked to produce free hydrogen which migrates through the oxide layer and combines with the As to neutralize the As. The alternative oxidants and reducing agents may be provided to the AlAs layer either in addition to water vapor or in place of water vapor.

Gaseous $AsH_3$ is included in the list of alternative reduction agents. When the temperature of the semiconductor is sufficiently low (for example, 500° C.) the hydrogen from the cracked $AsH_3$ is able to migrate into the oxide layer and bind up the interstitial As found within the oxide layer as arsine. The free As produced by cracking the arsine is unable to migrate into the oxide layer below 500° C. along with the hydrogen. Thus $AsH_3$ may be used as a source of hydrogen for removing excess As from the oxide layer.

An advantage in providing an alternative gas mixture which includes additional hydrogen is that the relative concentrations of oxygen and hydrogen may be altered in order to optimize the processes of arsenic replacement and of arsenic removal independently of each other.

The AlAs layer 24 is lattice-matched to the underlying GaAs layer 22. However, after oxidation, the $Al_2O_3$ layer 26 has a volume which is around one half of the volume of the original AlAs layer 24, and so the $Al_2O_3$ is not well lattice-matched to the GaAs layer 22, which leads to stress within the semiconductor structure. However, known methods are available for overcoming the problems of induced crystal stress, including the use of ductile materials for relieving the stress, and reduction of the thickness of the $Al_2O_3$ layer, which produces less stress on the underlying GaAs layer.

It has been found that the oxidizing process is most favorably carried out by oxidizing through an edge of the AlAs layer, rather than through a planar surface, advantageously allowing efficient oxidation of a stack of AlAs layers to be carried out. The inventors have shown that the oxidation process is more effective for AlAs layers which are thin, preferably having a thickness, dimension t as shown in FIG. 1A, of less than 10,000 Å and more preferably less than 1000 Å. The inventors have also shown that the oxidation process is more effective for layers having a width, shown as w in FIG. 1A, which preferably is less than 100 $\mu$m and which is more preferably less than 1 $\mu$m. The width w corresponds to the separation between the source and drain regions in an FET, otherwise known as the gate width.

Figure 3:
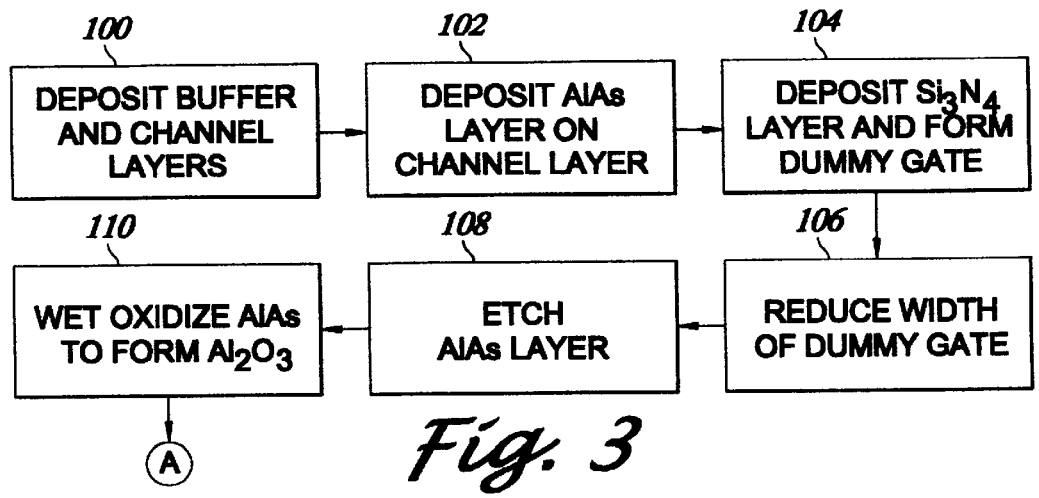
FIGS. 3–5 illustrate method steps in fabricating a field effect transistor.
Figure 4:
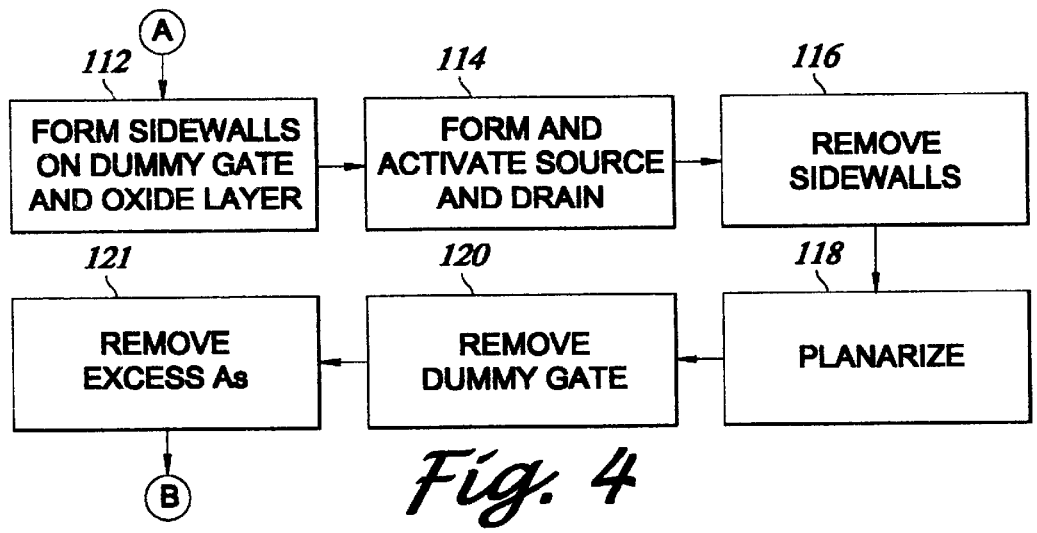
Figure 5:
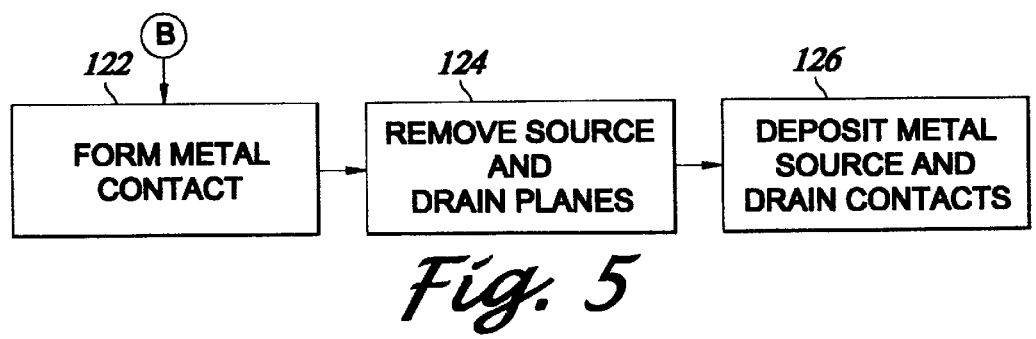

FIG. 2 illustrates sequential fabrication stages for a GaAs-based metal-insulator-semiconductor FET (MISFET), based on the production of an oxide layer according to the process illustrated in FIG. 1. The GaAs MISFET displays logic characteristics similar to logic characteristics of a silicon-based metal-oxide-silicon field effect transistor (MOSFET). Related FIGS. 3–5 illustrate the sequence of procedure steps required to produce the device illustrated in FIG. 2. Without limiting the invention, the fabrication of the various regions in the following MISFET device is described for a doping process using ion implantation. It is understood that doping various regions of the MISFET device, for example the wells and the channels, may also be carried out using other known fabrication processes such as ion diffusion. In addition, layers which are grown, such as the AlAs layer in the following description, may be grown using one of a number of growth methods, including molecular beam epitaxy (MBE), metal-organic chemical vapor deposition (MOCVD), and liquid phase epitaxy (LPE).

During the course of fabrication, masks are formed on the top surface of the structure to shield certain portions of the semiconductor from e.g. the diffusion process or the growth process. The masks are fabricated using photolithography. The process of photolithography entails the deposition of a layer of photosensitive material on the top surface of the semiconductor structure. Certain portions of the photosensitive layer are covered by a photomask and the photomask is exposed to light, forming a latent image of the photomask in the photosensitive layer. The photosensitive layer is chemically developed. After developing, those portions of the photosensitive material which were exposed to the light are removed, typically by washing with water. Those portions of the photosensitive material which were shielded from exposure by the photomask remain on top of the semiconductor structure, and act as a mask for the subsequent processing step. The mask is typically removed by washing with acetone. A further description of the photolithography process may be found in most standard semiconductor textbooks, for instance "Device Electronics for Integrated Circuits" by R. S. Muller and T. I. Kamins, John Wiley, New York, 1977.

An n+ buffer layer 42 is grown on a substrate 40, preferably an n+ GaAs substrate, to produce the structure shown in FIG. 2A. The buffer layer 42 is preferably a layer of GaAs having a thickness of approximately 2000 Å. A channel layer of n-GaAs 44 is grown on the buffer layer 42. The channel layer 44 is preferably doped to a concentration of approximately $10^{17}$ cm$^{-3}$, and preferably has a thickness of approximately 1000 Å. A layer of AlAs 46, preferably having a thickness of approximately 500 Å, is grown on the channel layer 44. A silicon nitride ($Si_3N_4$) layer is then grown on top of the AlAs layer 46. A dummy gate 48 of $Si_3N_4$ is formed on the AlAs layer 46 using a conventional photolithographic process to have a width typically ranging from 1 $\mu$m to 0.5 $\mu$m. The dummy gate 48 is then preferably reduced in width to approximately 0.2 $\mu$m by an etch process, such as plasma etch, reactive ion etch (RIE) or the like, resulting in a gate width that is narrower than the resolution of the photolithographic process.

The AlAs layer 46 is etched to remove the AlAs material lying outside the gate region, leaving only a gate portion 50 of AlAs, which is covered by the dummy gate 48, as shown in FIG. 2B. The gate portion 50 is then wet oxidized by exposing the AlAs of the gate portion 50 to water vapor, thus converting the AlAs gate portion 50 to an $Al_2O_3$ gate oxide layer 52, as shown in FIG. 2C.

Next, two $Si_3N_4$ sidewalls 54 and 56 are formed on the gate oxide layer 52 and dummy gate 48, as shown in FIG. 2D. The sidewalls define the self-aligned spacing between the gate and the source/drain of the resulting FET. A source region 58 and a drain region 60 are formed, as shown in FIG. 2E. The source and drain regions 58 and 60 are formed by an ion implantation procedure, typically a silicon implant at 50 keV but may also be formed by ion diffusion. The ion-bearing source and drain regions are activated after implantation by rapid thermal annealing for 5 min. at 900° C. The thickness of the sidewalls 54 and 56 determine the spacing of the source and drain regions 58 and 60 from the gate oxide layer 52. The dummy gate 48 and gate oxide layer 52 shield a portion of the channel layer 44 from ion implantation, the shielded portion of the channel layer 44 forming a channel region 62.

Figure 2F:
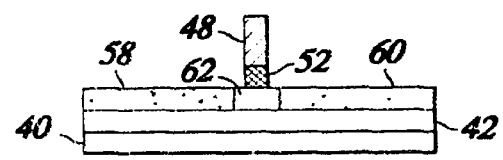
Figure 2G:
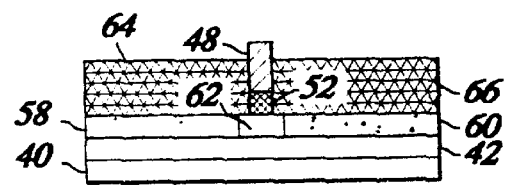
Figure 2H:
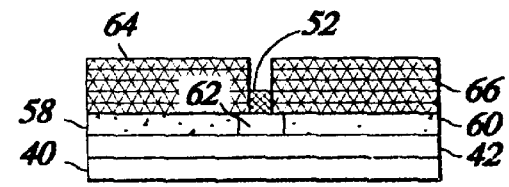
Figure 2I:
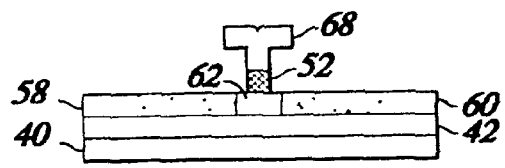
Figure 2J:
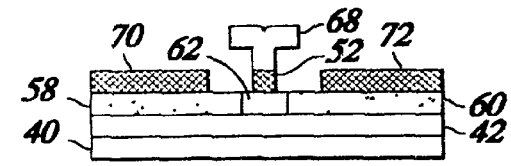

After the ion implantation step, the sidewalls 54 and 56 are removed using RIE or other etching process, as shown in FIG. 2F. The etching process is controlled so as to avoid removing the dummy gate 48. Next, a planarization process, using PMGI, is carried out to produce the structure shown in FIG. 2G, where a source plane 64 and a drain plane 66 are deposited above the source and drain regions 58 and 60 respectively. Once the source and drain planes 64 and 66 are in place, the dummy gate 48 is removed using hydrofluoric acid (HF), as shown in FIG. 2H.

A metal contact 68 is formed on the gate oxide layer 52. Without limiting the invention, it is preferable to reduce the input impedance, that is the input resistance and capacitance, if the MISFET is to be employed as a high frequency power amplifier. A low input impedance may be achieved using a T-shaped metal contact. Thus, a T-shaped contact is formed using the source and drain planes 58 and 60 for forming the head portion of the T-shape. The source and drain planes 64 and 66 are then etched off, resulting in the structure shown in FIG. 2I. Lastly, a metal source contact 70 and a metal drain contact 72 are deposited on the source and drain regions 58 and 60 respectively. A conventional planar metal contact may also be deposited on the gate oxide layer 52.

Referring once more to FIGS. 3–5, the steps for manufacturing the GaAs MISFET are now described, with reference to the device fabrication stages shown in FIG. 2. Step 100 describes depositing a buffer layer 42 and a subsequent channel layer 44 on a substrate. Step 102 describes growing an AlAs layer 46 on the channel layer 44. Step 104 describes depositing a $Si_3N_4$ layer on the AlAs layer 46, and forming a dummy gate 48 from the $Si_3N_4$ layer using photolithographic techniques. Step 106 describes reducing the width of the dummy gate 106 using an etching procedure to a width below the resolution of the photolithographic process. Step 108 describes etching the AlAs layer 46, to leave a gate portion 50 of AlAs lying below the dummy gate 48. Step 110 describes wet oxidizing the gate portion 50 of AlAs to produce an $A_2O_3$ gate oxide layer 52. Step 112 describes forming Si$_3$N$_4$ sidewalls 54 and 56 on the sides of the dummy gate 48 and the gate oxide layer 52. Step 114 describes forming self-aligned source and drain regions 58 and 60 by ion implantation and activation by rapid thermal annealing or furnace annealing. The source and drain formation described in step 114 also results in the formation of the channel region 62 lying between the source and drain regions 58 and 60. Step 116 describes removing the sidewalls 54 and 56. Step 118 describes planarizing to form source and drain planes 64 and 66. Step 120 describes removing the dummy gate 48 using a hydrofluoric acid etch. Step 121 describes hydrogenizing the oxide layer 52 and the interface between the gate oxide layer 52 and the channel region 62 to remove excess As. Step 122 describes forming a T-shaped metal contact 68 on the gate oxide layer 52, using the source and drain planes 64 and 66 to form the head of the "T". Step 124 describes removing the source and drain planes 64 and 66. Step 126 describes depositing metal contacts 70 and 72 on the source 58 and drain 60 respectively to complete the device.

Control of Excess Arsenic

The oxidation process described hereinabove may not result in the removal of all the arsenic from the AlAs layer. Arsenic may be substantially replaced by oxygen to form Al$_2$O$_3$. However, some arsenic atoms may not form AsH$_3$ and thence be removed as a gaseous byproduct, but may remain in the oxide layer. The presence of excess As in the oxide layer consequently results in a reduction in the resistivity of the oxide layer by providing a conduction path for carriers through the oxide layer. In addition, the migration of excess As from the oxide layer to the GaAs layer results in the production of a high density of surface states, and may produce AS$_{Ga}$ antisites in the underlying GaAs layer. The surface states produce mid-gap (EL-2) type impurity levels which affect the electrical performance of the device, such as the I–V characteristics.

Ideally in a FET device, there is no voltage drop across the gate oxide layer, and the full applied voltage is available for producing the electric field in the channel. The occurrence of a voltage drop across the oxide layer, as may occur due to a reduced oxide layer resistivity or an increased interface state density, increases the voltage which must be applied to the gate in order to achieve a certain channel field and results in increased heating and a reduced device efficiency. Additionally, an increased density of surface states, and concomitant EL-2 levels, has a deleterious effect on the FET channel layer.

It is, therefore, advantageous to reduce the interface state density, and also to avoid reducing the resistivity of the gate oxide layer, by removing excess As from the oxide layer. Excess As removal may be achieved as discussed hereinabove by using alternative oxidation gas mixtures having variable hydrogen proportions, or may be achieved using specific semiconductor device structures.

FIGS. 6A–6D illustrate four embodiments of the invention for controlling the excess arsenic in the oxide layer, by either physically removing the excess arsenic from the active layer or by rendering the excess arsenic neutral.

Figure 6A:
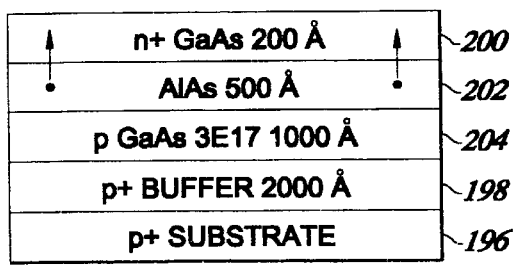

FIG. 6A illustrates a first embodiment of a device structure for removing excess As from the oxide layer, prior to oxidation. The first embodiment makes use of the fact that excess As may effectively be moved under the influence of an electric field, as has been demonstrated by the inventors. The first embodiment includes a 200 Å thick n+ GaAs layer 200 deposited over an original 500 Å AlAs layer 202 which is later oxidized to become an Al$_2$O$_3$ layer 202' (not shown). The AlAs layer 202, in turn is deposited on top of a p-GaAs layer 204, preferably doped to a level of approximately $3 \times 10^{17}$ cm$^{-3}$. The p-GaAs layer 204 may, for example, be a channel in a FET. The p-GaAs channel layer 204 and the n+ GaAs layer 200 form a p-n junction. The p-GaAs channel layer 204 is deposited on a p+ buffer layer 198, which in turn is deposited on a p+ substrate 196. Since As is an electron donor, the As atoms in the oxide layer 202' have net positive charge and migrate towards the n+ GaAs layer 200, in the direction shown by the arrows, under the influence of the intrinsic electric field of the depletion region of the p-n junction. It is understood that the n+ layer in this embodiment is not restricted to being formed from GaAs, but may also be formed from other semiconductor materials including, but not being limited to, aluminum gallium arsenide (AlGaAs) and indium gallium phosphide (InGaP). Note that this embodiment is useful where the GaAs layer 204 underlying the AlAs layer 202 is doped to be p-type. This embodiment is not useful where the GaAs layer 204 is n-type, since the electric field of a p-n junction having an n-type GaAs layer 204 would result in driving the excess As into the GaAs layer 204, rather than away from the GaAs layer 22.

Figure 6B:
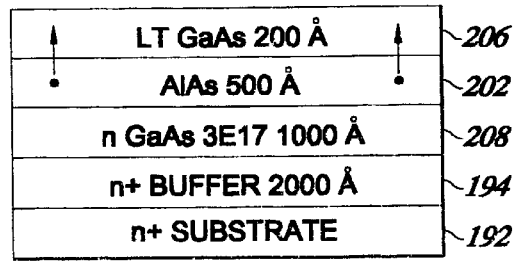

A second embodiment of the invention for reducing excess As is illustrated in FIG. 6B, including a low temperature grown (LTG) GaAs layer 206 on top of the AlAs layer 202. The AlAs layer 202 is deposited on a layer of n-GaAs 208 which, in turn, is deposited on an n+ buffer layer 194. The n+ buffer layer has been deposited on an n+ substrate 192. LTG GaAs is known to have a large number of Ga vacancies. It is energetically more favorable for As to occupy a Ga vacancy than to remain free as an interstitial. Therefore, after the AlAs layer 202 has been oxidized, the excess As preferably migrates into the LTG GaAs layer 206, in the direction shown by the arrows, to occupy the Ga vacancies. This second embodiment is not restricted to using an LTG GaAs layer. Other materials may be used to form a layer having vacancies, alternatively known as a semiconductor vacancy layer, into which the excess As is attracted.

Figure 6C:
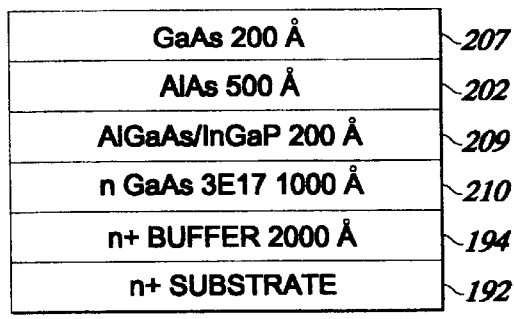

A third embodiment of the invention for reducing excess As is illustrated in FIG. 6C, which has a GaAs layer 207 deposited above the AlAs layer 202, and a 200 Å layer of a wide gap material 209, preferably AlGaAs or InGaP, positioned between the n-GaAs layer 210, and the AlAs layer 202. It has been found by the inventors that wide gap materials such as AlGaAs and InGaP serve as effective barriers against As migration and, therefore, prevent the migration of excess As into the n-GaAs layer 210 from the oxide layer 202'.

Figure 6D:
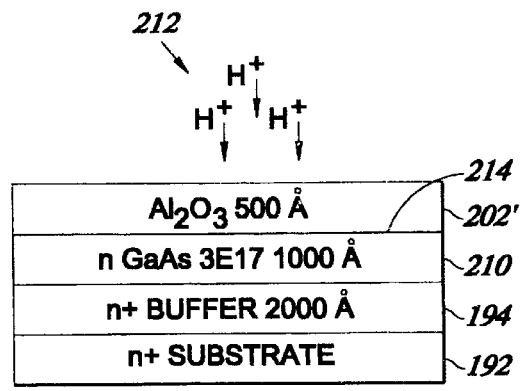

A fourth embodiment of the invention for reducing excess As is shown in FIG. 6D. A layer of AlAs 202 is deposited on directly on top of an n-GaAs layer 210. After the AlAs layer 202 has been wet oxidized to produce the oxide layer 202', the oxide layer 202' is then hydrogenated. Hydrogenation is preferably carried out by exposing the oxide layer 202', containing excess As, to a plasma containing hydrogen ions 212. The hydrogenation process also hydrogenates the interface 214 between the oxide layer 202' and the GaAs layer 210. The plasma 212 removes the excess arsenic ions from the oxide layer 202' and the interface 214 by providing excess hydrogen in the oxide layer 202' which combines with the excess As to form arsine gas, AsH$_3$. The arsine gas then migrates out of the oxide layer 202' and is removed. The hydrogen ions in the plasma 212 are preferably accelerated to an energy of 200 electron volts (eV) prior to impacting the oxide layer 202', and the oxide layer is preferably exposed to the plasma for a duration of approximately 15 mins. In addition to vertical hydrogenation, as shown in FIG. 6D where the hydrogen plasma is normally incident on the surface of the $Al_2O_3$ oxide layer, the plasma hydrogenation may also take place through the edge of the oxide layer, in a direction perpendicular to the surface of the $Al_2O_3$ layer. The interface state density is related to the concentration of excess arsenic. By removing excess arsenic in the hydrogenation process, the interface state density is reduced.

Successfully lowering the concentration of excess As in the oxide layer 24 results in improved device properties, such as I–V characteristics, a high electric field in the channel and efficient operation of a FET constructed using an $Al_2O_3$ layer formed on a GaAs layer.

Experimental Results

Figure 7:
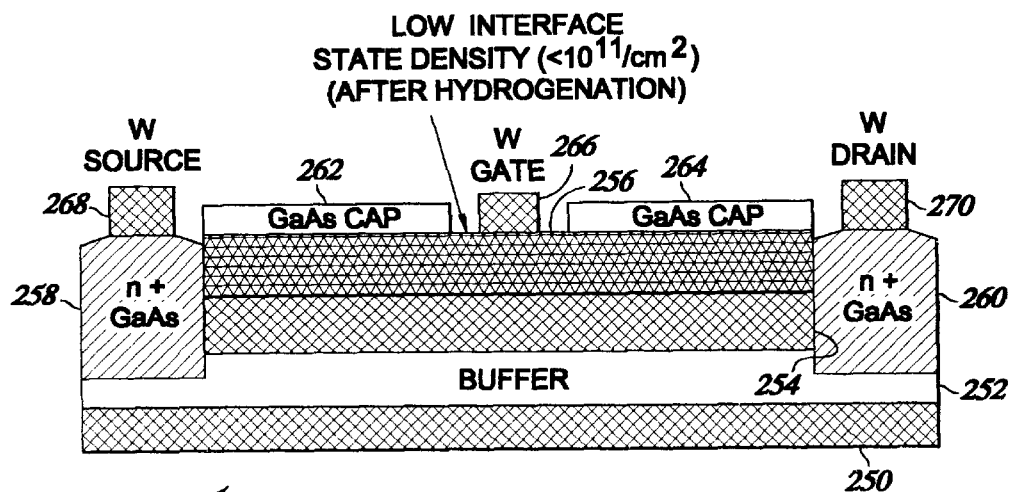
FIG. 7 illustrates the structure of a MISFET fabricated in accordance with the present invention.

Experimental studies have been carried out on a depletion-mode GaAs MISFET 248, whose structure is shown in FIG. 7. The MISFET 248 includes a substrate 250, on top of which is deposited a buffer layer 252. On the buffer layer 252 is a channel region 254 formed from n-GaAs. On the channel region 254 is a layer of $Al_2O_3$ 256, formed on the n-GaAs layer 254 using the wet oxidation process described hereinabove. The oxidation process took place at a temperature of 450° C. in an atmosphere of $N_2$ and $H_2O$ vapor. The MISFET 248 includes n+ GaAs source and drain regions 258 and 260, and has source and drain GaAs caps 262 and 264 over the oxide layer 256 proximate the source and drain regions respectively. The gate electrode 266 and source and drain electrodes 268 and 270 are formed from deposited tungsten (W). The oxide layer 256 was hydrogenated to produce an interface state density of less than $10^{11}$ $cm^{-2}$ at the interface between the oxide layer 256 and the n-GaAs layer 254. Pinch-off of the MISFET 248 requires that the Fermi level move freely through the gap.

Figure 8:
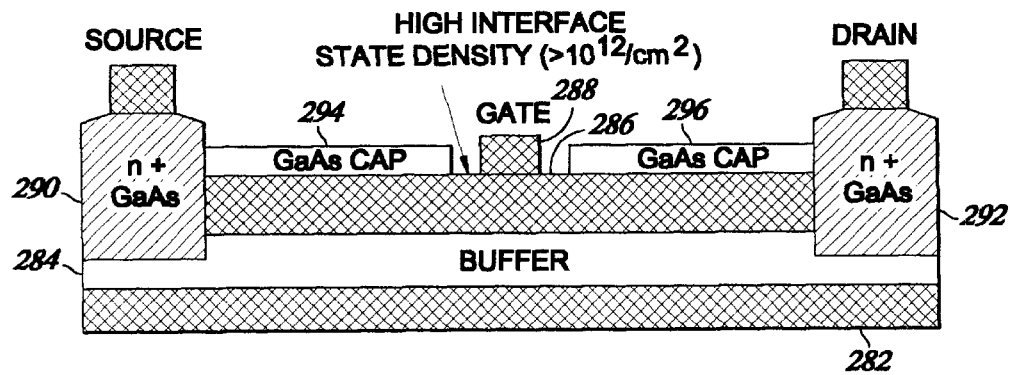
FIG. 8 illustrates the structure of a conventional MESFET.

In FIG. 8 is shown a known metal-semiconductor FET (MESFET) device 280 for comparison with the MISFET 248 of FIG. 7. The MESFET 280 has a substrate 282, upon which are successively deposited a buffer layer 284 and an n-GaAs channel layer 286. A gate electrode 288 is deposited directly on the n-GaAs channel layer 286, and n+ GaAs source and drain regions 290 and 292 are disposed on opposing sides of the gate 288. The device is completed with source and drain GaAs caps 294 and 296 deposited on the n-GaAs channel layer 286. In the MESFET 280, the density of interface states at the interface between the n-GaAs channel layer 286 and the gate electrode 288 is greater than $10^{12}$ $cm^{-2}$, more than a factor of ten higher than for the hydrogenated MISFET 248.

Figure 9:
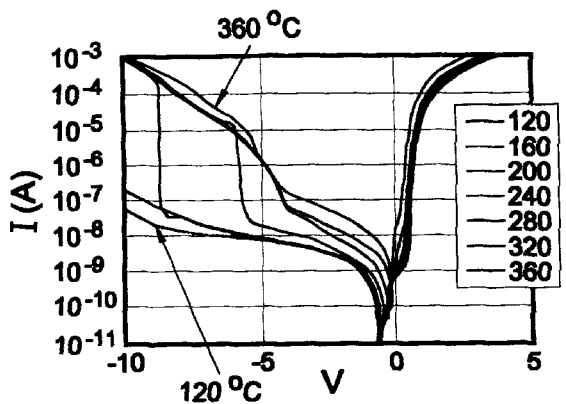
FIGS. 9 and 10 illustrate I–V characteristics for a MISFET having a high density of interface states.
Figure 10:
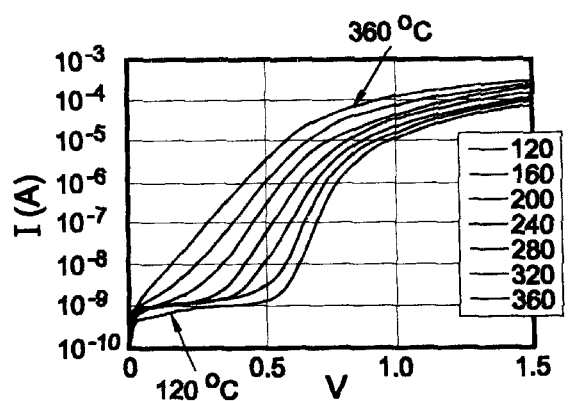

In FIG. 9 is shown the I–V characteristic for a MISFET 248 for a range of temperatures, 120° C. to 360° C., and under biasing conditions of −10 V to +4 V. In FIG. 10 is shown an expanded view of the I–V characteristic shown in FIG. 9 for the portion of the bias voltage ranging from 0 V to 1.5 V showing I versus $V_{ds}$ at zero gate bias. The MISFET used to produce the results I–V characteristic illustrated in FIGS. 9 and 10 had an oxide layer which had not been treated for controlling excess arsenic, and so the MISFET had a high interface state density. The high interface state density is reflected in the incomplete pinch-off of the device (the failure to demonstrate zero current under zero bias conditions) and the large hysteresis in the gate-diode breakdown under reverse bias conditions. Both the pinch-off and hysteresis characteristics are illustrated in FIG. 9. An indication of the nature of the interface states is obtained via the forward characteristics shown in FIG. 10, where the carrier transport is probably due to thermionic emission. The barrier height is calculated to be 0.72 eV from the results shown in FIG. 10, which barrier height is nearly identical to the barrier height of W directly deposited on GaAs. This suggests that the Fermi level is pinned at the oxide/GaAs interface by the same defect as at the free GaAs surface, in other words by the $AS_{Ga}$ anti-site. Furthermore, the high resistance in the forward diode characteristic suggests that the oxide layer does not act as a tunnel barrier, but rather as a highly resistive ohmic path to the gate diode. The high conductivity of the oxide layer may be caused by unreacted As forming a semi-metallic path in the oxide.

Figure 11:
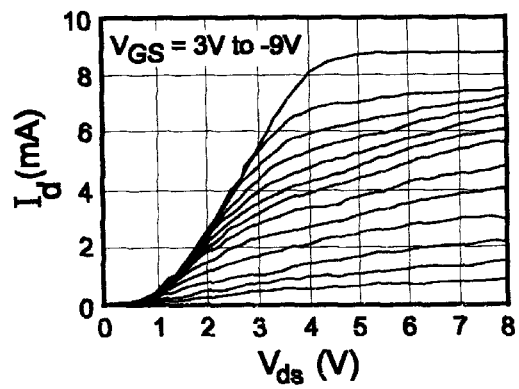
FIG. 11 illustrates I–V characteristics for a MISFET having a low density of interface states prior to hydrogenation of the oxide layer.

The I–V characteristics of a second MISFET, having a lower interface state density than the device used to produce the results of FIGS. 9 and 10, are presented in FIG. 11. This Figure shows drain current, $I_d$, in milliamperes, plotted against the voltage across the source and drain, $V_{ds}$, in Volts, for a number of values of gate-source voltage, $V_{GS}$, ranging from 3 V to −9 V. It is seen that the MISFET successfully pinches off at zero bias, unlike the device whose characteristics are shown in FIG. 9. However, $g_m$ compression, a reduction in $\delta I_d/\delta V_{ds}$, is observed near zero gate bias in FIG. 11, indicating the presence of interface states at the corresponding Fermi-level position.

Figure 12:
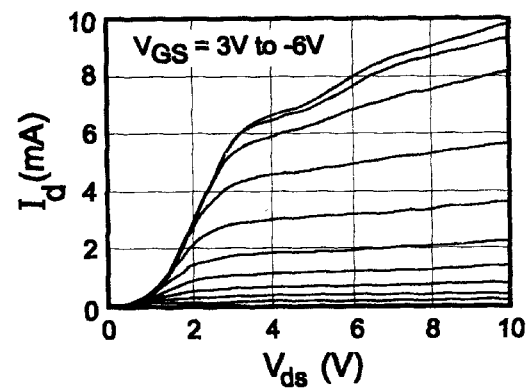
FIG. 12 illustrates I–V characteristics for a MISFET having a low density of interface states after hydrogenation of the oxide layer.

FIG. 12 illustrates the I–V characteristic for the same device whose I–V characteristic is shown in FIG. 11, but where I–V characteristic was measured after the oxide layer had been subjected to room temperature hydrogenation. The room temperature hydrogenation step was carried out by exposing the oxide layer for a duration of 30 minutes to hydrogen ions accelerated to an energy of 500 eV. The inventors have previously shown that this type of hydrogenation treatment is effective at removing As from a GaAs surface in the form of volatile $AsH_3$. The value of $g_m$ ($\delta I_d/\delta V_{ds}$) for this device is higher than for the device whose characteristic is shown in FIG. 11. In addition, the gate diode characteristic shows a weak temperature dependence, which is indicative of tunneling transport and not of thermionic emission.

These results of these experiments illustrate that, with controlled oxidation and subsequent treatment to reduce excess residual As, an $Al_2O_3$ layer suitable for use as a gate insulator for a FET can be obtained.

CMOS Logic Devices

The formation of an $Al_2O_3$ gate oxide layer on GaAs FET structures may also be implemented in complementary metal-insulator-semiconductor (CMIS) circuits, which are analogous to silicon-based complementary metal-oxide-semiconductor (CMOS) circuits. As with CMOS circuits, CMIS circuits having negligible standby power consumption can be built for logic operations using paired n-channel and p-channel MISFETS (hereinafter referred to as n-MISFETs and p-MISFETS respectively).

Figure 14:
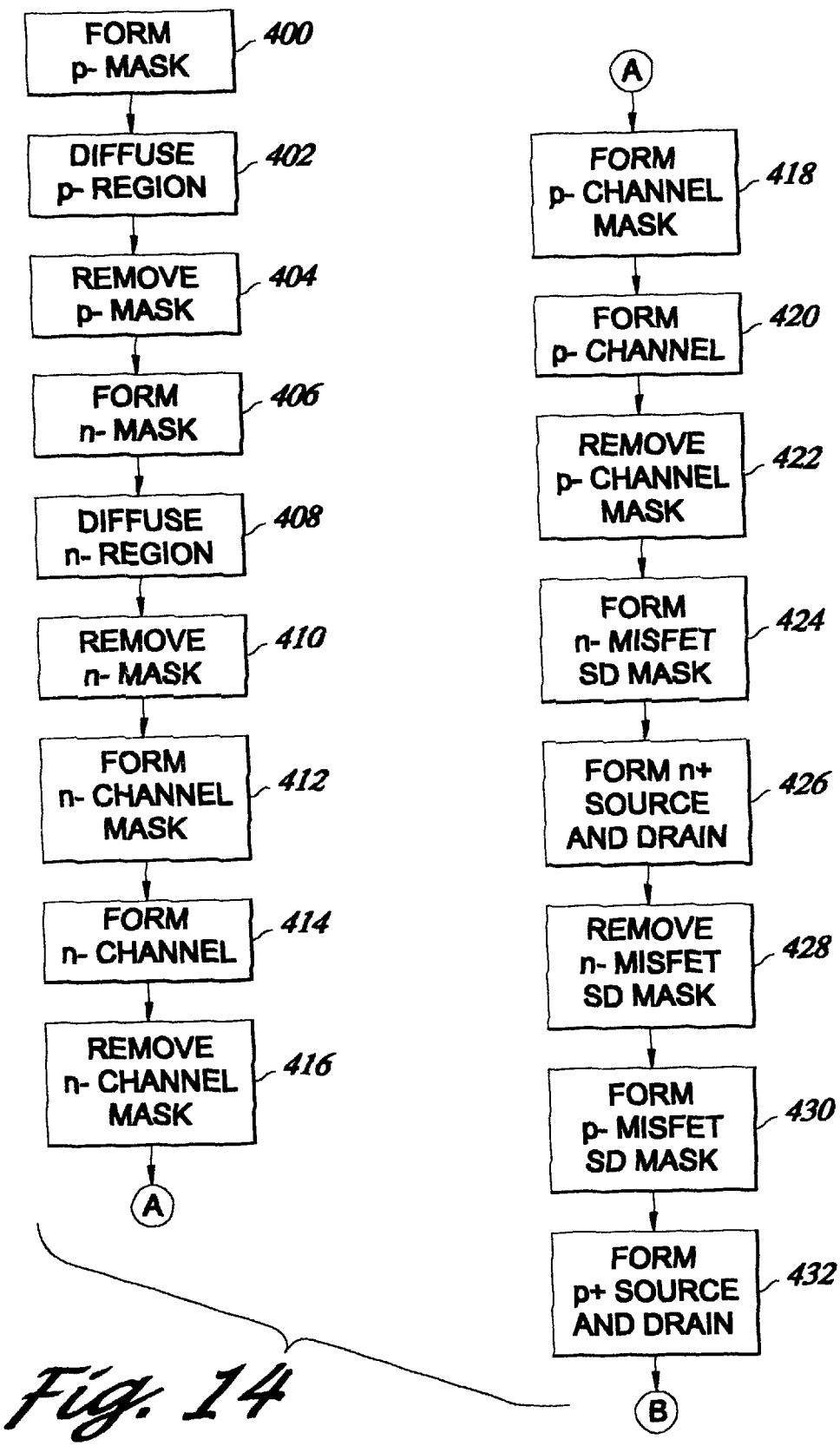
FIGS. 14 and 15 illustrate various method steps for fabricating a GaAs CMIS device.
Figure 15:
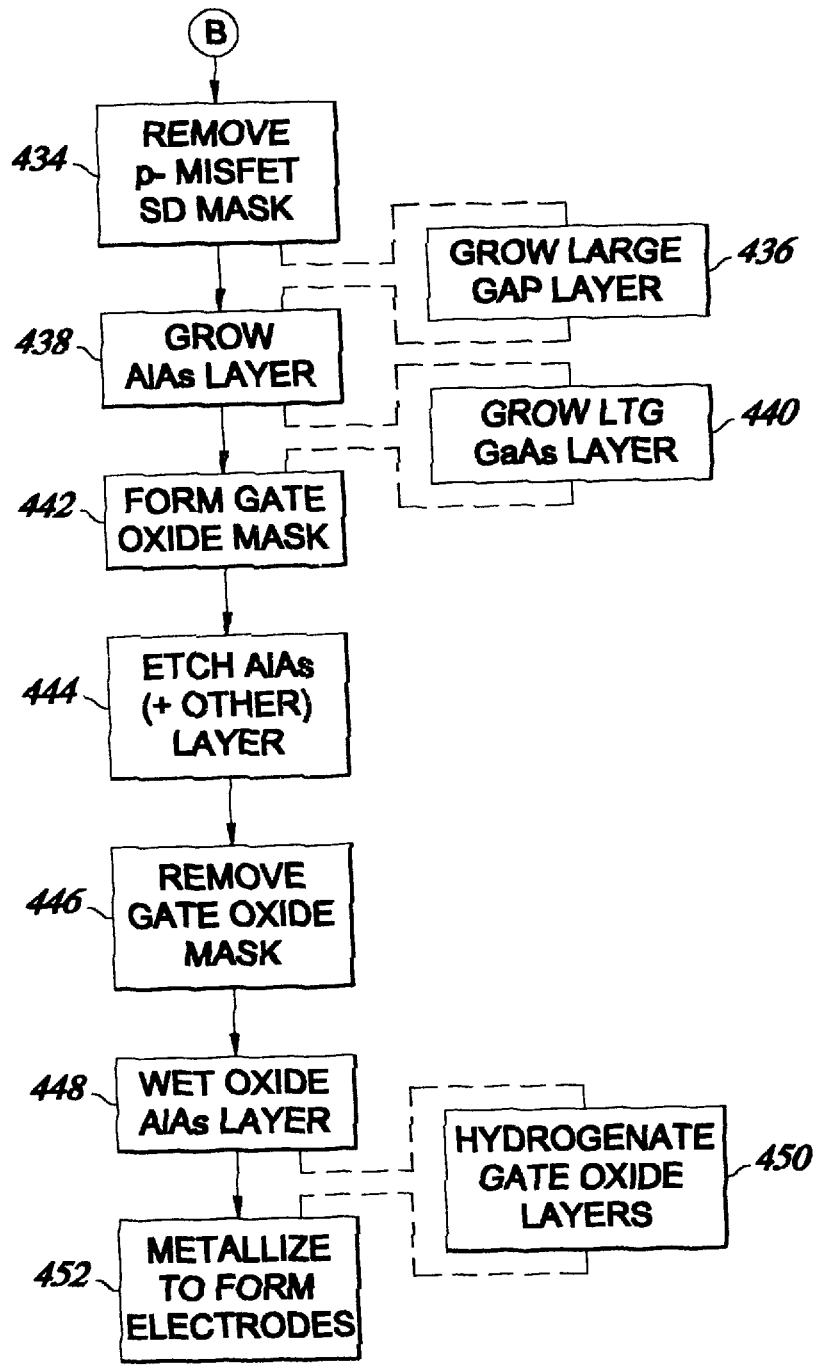

FIG. 13 illustrates various fabrication stages of a GaAs CMIS device, such as an invertor, having a single n-channel MISFET and a single p-channel MISFET fabricated on a common substrate. FIGS. 14–15 illustrate the various fabrication steps associated with fabricating the device shown in FIG. 13. Without limiting the invention, the fabrication of the various regions in the following CMIS device is described for a fabrication process using ion diffusion. It is understood that the fabrication of various regions of the CMIS device, for example the wells and the channels, may also be carried out using other known fabrication processes such as ion implantation. In addition, the growth of layers, such as the AlAs layer, may take place through the use of one of a number of known growth methods, including MBE, MOCVD, and liquid phase epitaxy. The various masks used for each fabrication stage are typically formed using a conventional photolithographic process.

Figure 13A:
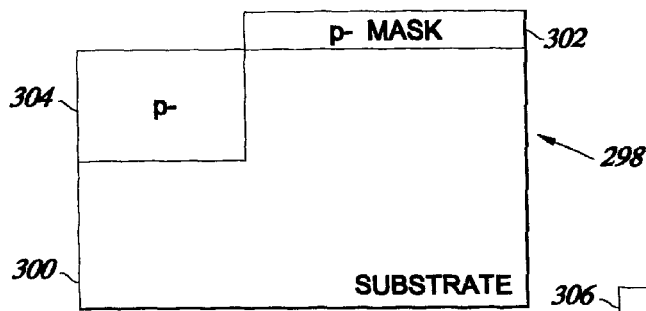
FIGS. 13A–13I illustrate various fabrication stages of a GaAs CMIS device.
Figure 13B:
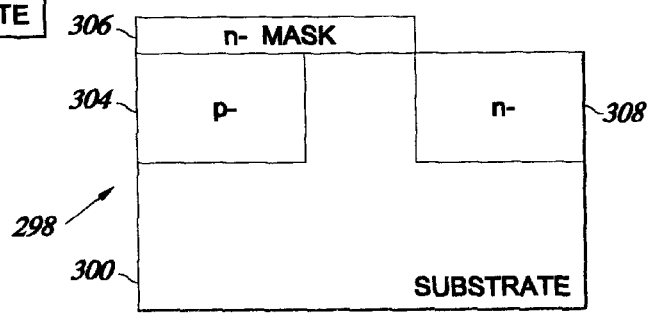

In FIG. 13A is shown a semiconductor structure 298 which includes a substrate 300, preferably an intrinsic GaAs substrate, on which is formed a p- mask 302. The p- mask 302 is advantageously formed from a photosensitive layer in which a p- mask pattern has been exposed and developed to leave an exposed area of substrate 300. A p- region 304 is formed through diffusion of an acceptor species into the substrate. The p- mask 302 is then removed, and the process repeated to produce an n- region. An n- mask 306 is formed on the substrate, to expose a region in the substrate, adjacent the p- region 304, into which an n- region 308 is diffused using a donor species. The resulting structure 298 is shown in FIG. 13B. The n- mask 306 is then removed.

Figure 13C:
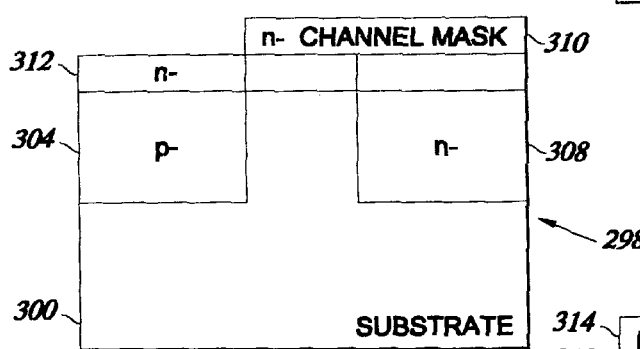
Figure 13D:
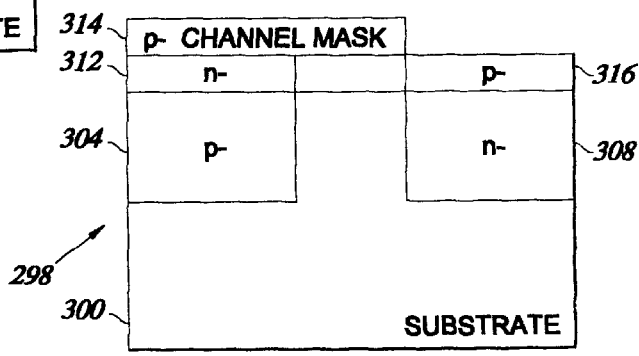

An n- channel mask 310 is formed over the substrate 300, to expose a region in the device into which a shallow n- channel 312 is diffused. The n- channel 312 substantially overlaps the p- region 304 as shown in FIG. 13C. The n- channel mask is then removed, and a p- channel mask 314 formed. The p- channel mask 314 exposes an area of the device into which a shallow p- channel 316 is diffused. The p- channel 316 substantially overlaps the n- region 308 as shown in FIG. 13D. The p- channel mask 314 is then removed.

Figure 13E:
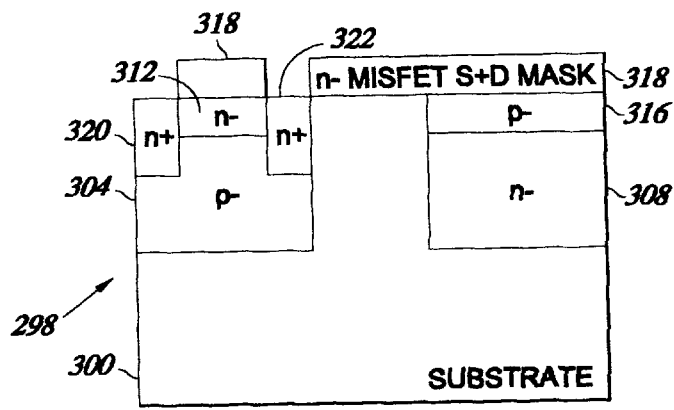
Figure 13F:
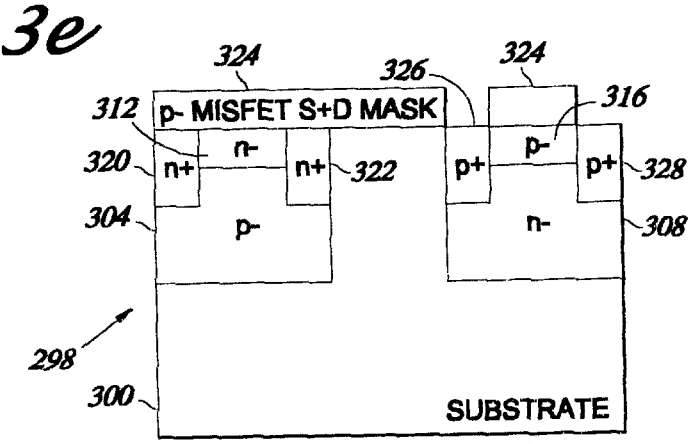

An n-MISFET source and drain (SD) mask 318, is photolithographically formed on top of the semiconductor structure 298. The n-MISFET SD mask 318 exposes those areas where the source 320 and drain 322 for the n-channel MISFET are to be formed. Two n+ regions are formed by diffusion to produce the source 320 and drain 322, as shown in FIG. 13E. After the n-MISFET SD mask 318 has been removed, a p-MISFET SD mask 324 is formed photolithographically. The p-MISFET SD mask 324 exposes those areas where the source 326 and drain 328 of the p-MISFET are to be formed. Two p+ regions are formed by diffusion to produce the source 326 and drain 328 for the p-MISFET, as shown in FIG. 13F. The p-MISFET SD mask 326 is then removed.

Figure 13G:
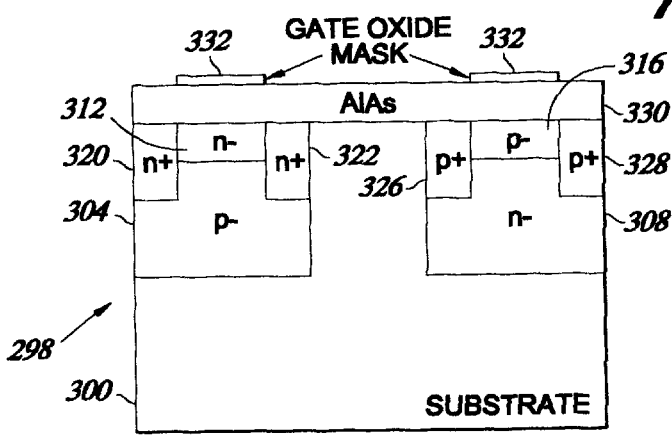
Figure 13H:
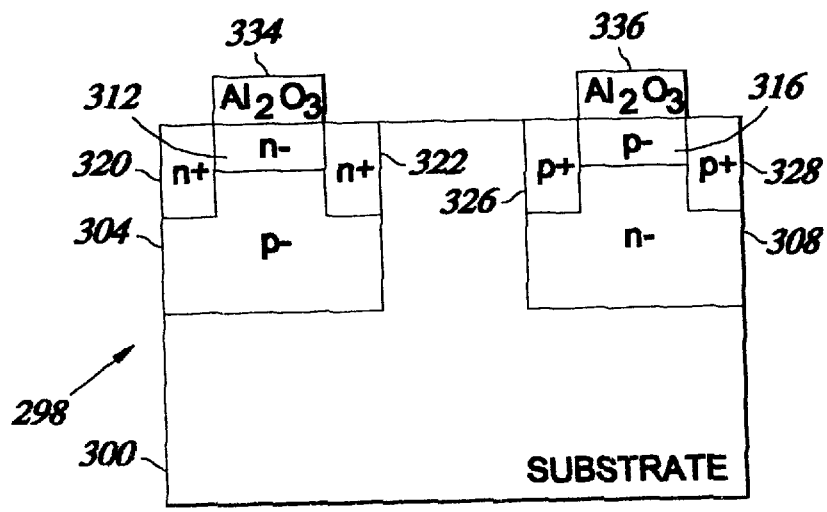
Figure 13I:
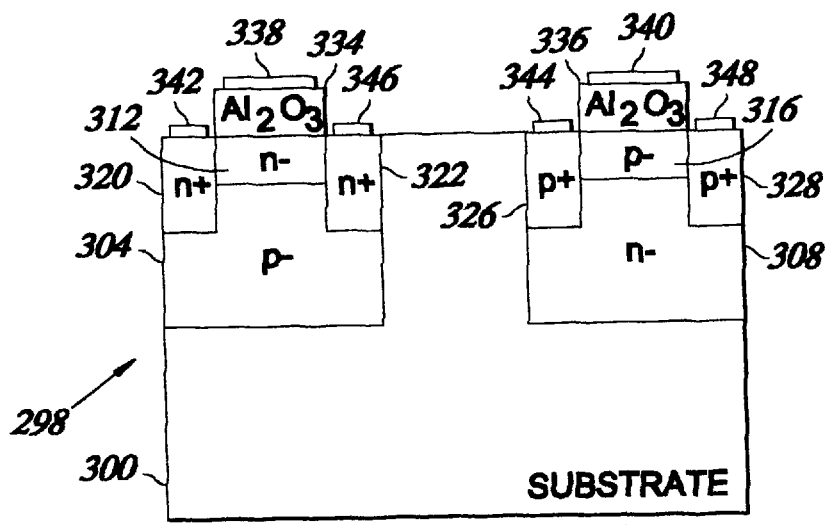

A layer of AlAs 330 is then grown on top of the structure 298, and a gate oxide mask 332 is formed on top of the AlAs layer 330. The gate oxide mask 332 exposes those portions of the AlAs layer where it is desired to form a gate oxide layer, preferably above the channel regions 312 and 316 as shown in FIG. 13G. The AlAs layer is etched, and the gate oxide mask 332 removed. The remaining portions of AlAs are subjected to a wet oxidation, and are converted to $Al_2O_3$ gate oxide layers 334 and 336, FIG. 13H. Following formation of the gate oxide layers 334 and 336, the CMIS device is completed by following a conventional metallization step to form gate electrodes 338 and 340 on gates 334 and 336 respectively, source electrodes 342 and 344 on sources 320 and 326 respectively, and drain electrodes 346 and 348 on drains 322 and 328 respectively, as shown in FIG. 13I.

Referring once more to FIGS. 14 and 15, step 400 describes forming a p- mask 302 on a substrate 300, preferably an intrinsic GaAs substrate. The p-mask 302 is advantageously formed from a photosensitive layer in which a p- mask pattern has been exposed and developed to leave an exposed area of substrate 300 for forming a p- region. Step 402 describes forming a p- region 304 by diffusion of an acceptor species into the substrate 300. Step 404 describes the removal of the p- mask 302. Step 406 describes forming an n- mask 306 for producing an n- well. Step 408 describes forming an n- region by diffusion of a donor species into the substrate 300. Step 410 describes removing the n- mask 306.

Step 412 describes forming an n-channel mask 310 over the substrate 300, to expose a region in the device into which a shallow n- channel 312 is to be diffused. Step 414 describes forming the n- channel 312 in the p- region 304 by diffusion. The n- channel 312 thus formed substantially overlaps the p- well 304. Step 416 describes removing the n- channel mask. Step 418 describes forming a p- channel mask 314, which exposes an area of the device 298 into which a shallow p- channel 316 is to be diffused. Step 420 describes forming the p- channel by diffusion. The p- channel 316 substantially overlaps the n- region 308. Step 422 describes removing the p- channel mask 314.

Step 424 describes photolithographically forming a n-MISFET SD mask 318 on top of the semiconductor structure 298. The n- MISFET SD mask 318 exposes those areas where the source 320 and drain 322 for the n-channel MISFET are to be formed. Step 426 describes forming two n+ regions by diffusion to produce the source 320 and drain 322. Step 428 describes removing the n-MISFET SD mask 318. Step 430 describes photolithographically forming a p-MISFET SD mask 324. The p- MISFET SD mask 324 exposes those areas where the source 326 and drain 328 of the p-MISFET are to be formed. Step 432 describes forming two p+ regions by diffusion to produce the source 326 and drain 328 for the p-MISFET. Step 434 describes removing the p-MISFET SD mask 326.

Step 438 describes growing the layer of AlAs 330 on the structure 298. Step 442 describes forming a gate oxide mask 332 on top of the AlAs layer 330. The gate oxide mask 332 exposes those portions of the AlAs layer 330 where it is desired to form a gate oxide layer, preferably above the channel regions 312 and 316. Step 444 describes etching the AlAs layer 330 is etched. Step 446 describes removing the gate oxide mask 332. Step 448 describes wet oxidizing the portions of AlAs remaining after etching in step 444, thus creating $Al_2O_3$ gate oxide layers 334 and 336. Step 452 describes metallizing the upper surface of the structure 298 to form gate electrodes 338 and 340 on gates 334 and 336 respectively, source electrodes 342 and 344 on sources 320 and 326 respectively, and drain electrodes 346 and 348 on drains 322 and 328 respectively.

Other steps may be included in the fabrication process for the CMIS device in order to control excess As according to the methods discussed hereinabove with respect to FIGS. 6A–6D. For example, the $Al_2O_3$ gate oxide layers 334 and 336 may be hydrogenated, step 450, before metallization, step 452, by exposing the layers to a hydrogen plasma. The dashed lines in FIG. 15 indicate alternate paths in the method steps.

Figure 16:
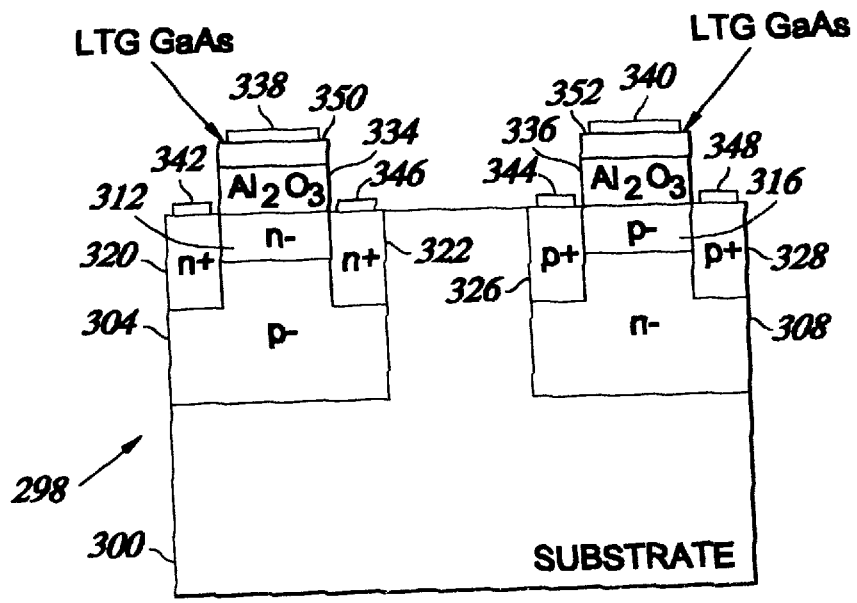

Alternatively, following the second embodiment for controlling excess As as shown in FIG. 6B, an LTG GaAs layer may be grown on top of the AlAs layer 330, step 440, prior to deposition of the gate oxide mask 332 at step 442. The subsequent etching step, step 444, then removes unwanted portions of both the LTG GaAs layer and the AlAs layer 330. The rest of the device fabrication process is followed as described above in regard to FIGS. 14 and 15, and the resulting device structure 298 is shown in FIG. 16. The device 298 is similar to that shown in FIG. 13I, but includes thin LTG GaAs layers 350 and 352 above the gate oxide layers 334 and 336 respectively. The LTG GaAs layer 350 and 352 attract excess As out of the gate oxide layers 334 and 336 respectively, to remove the As from the interfaces between the gate oxide layers 334 and 336, and the channel regions 312 and 316 respectively.

Figure 17:
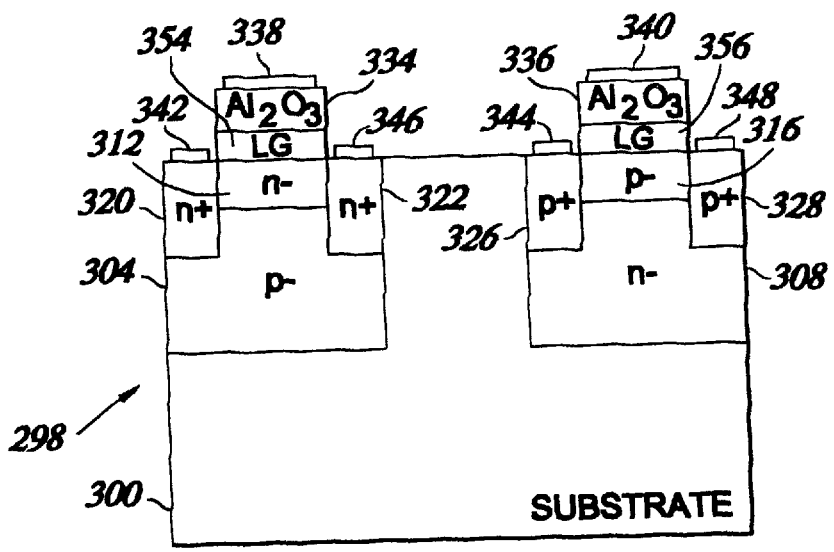

In accordance with the third embodiment for reducing excess As in the oxide layer as shown in FIG. 6C, a thin layer of a large gap (LG) material, such as AlGaAs or InGaP may be grown on the structure 298, step 436, prior to growing the AlAs layer 330 at step 438. The subsequent etching step, step 444, would remove unwanted portions of both the LG layer and the AlAs layer 330. The fabrication process is then continued as described above in regard to FIGS. 14 and 15, to produce the structure 298 shown in FIG. 17. This structure 298 is similar to that shown in FIG. 13I, but includes layers of LG material 354 and 356 below the gate oxide layers 334 and 336 respectively which block the migration of excess As into the channel regions 312 and 316 respectively.

This concludes the description of the preferred embodiment of the invention. The following paragraphs describe some alternative methods of accomplishing the same objects.

The channel regions in a CMIS device could be produced by growing a layer of GaAs, rather than by doping or ion implanting the substrate. The difference between the characteristics of devices using channels which were grown and doped or implanted is small. A grown layer, particularly one grown using MBE or MOCVD, is relatively free of dislocations and can have a specifically designed doping profile. On the other hand, a doped or ion implanted layer can be formed faster, and is therefore less expensive to fabricate. Although the discussion here has been in terms of a transistor, it is understood that the improvements discussed are also applicable to other semiconductor devices fabricated using planar technology, such as diodes and the like.

In summary, a method of forming an insulating layer on a GaAs layer has been described which enables the fabrication of GaAs-based field effect devices. Methods of forming the layer have been described, along with device configurations which are useful to remove excess arsenic from an oxide layer and thus better control the electrical properties of the semiconductor device. Because of these methods, a GaAs-based field effect transistor can be fabricated, which includes a stable gate oxide layer with advantageous electrical properties for FET operation. In addition, a CMIS device, capable of performing logic operations similar to those of a silicon-based CMOS logic device, and which uses complementary n- and p- MISFETs has been described.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of treating an aluminum oxide layer formed on a semiconductor layer, comprising the step of controlling excess arsenic released in the aluminum oxide layer when forming the aluminum oxide layer, the controlling step further comprising the step of hydrogenizing the aluminum oxide layer, wherein the hydrogenizing step further comprises exposing the aluminum oxide to hydrogen ions.

2. The method of claim 1, wherein the hydrogen ions are accelerated to an energy ranging from approximately 100 electron volts to approximately 300 electron volts.

3. The method of claim 1, wherein the hydrogen ions are accelerated to an energy of approximately 200 electron volts.

4. A method of treating an aluminum oxide layer formed on a semiconductor layer, comprising the step of controlling excess arsenic released in the aluminum oxide layer when forming the aluminum oxide layer, wherein the controlling step further comprises depositing an n- type layer over the layer of aluminum oxide.

5. The method of claim 4, wherein the n- type layer is formed from at least one material selected from the group consisting of gallium arsenide, aluminum gallium arsenide, gallium nitride, aluminum gallium indium phosphide, and indium phosphide.

6. A method of treating an aluminum oxide layer formed on a semiconductor layer, comprising the step of controlling excess arsenic released in the aluminum oxide layer when forming the aluminum oxide layer, wherein the controlling step further comprises depositing a vacancy semiconductor layer over the layer of aluminum oxide, the vacancy semiconductor layer having vacancies so as to attract the excess arsenic from the oxide layer.

7. The method of claim 6, wherein the vacancy semiconductor layer is a low temperature growth layer of gallium arsenide.

8. A method of treating an aluminum oxide layer formed on a semiconductor layer, comprising the step of controlling excess arsenic released in the aluminum oxide layer when forming the aluminum oxide layer, wherein the controlling step further comprises forming a semiconductor barrier layer between the semiconductor layer and the layer of aluminum oxide to prevent migration of excess arsenic.

9. The method of claim 8, wherein the semiconductor barrier layer is formed from at least one material selected from the group consisting of aluminum gallium arsenide and indium gallium phosphide.

10. A method of manufacturing a gallium arsenide field effect transistor having a gallium arsenide channel layer, a source and a drain, comprising the steps of:
   depositing an aluminum arsenide layer over the gallium arsenide channel layer;
   laterally oxidizing the aluminum arsenide layer by exposing the aluminum arsenide layer to an oxidizing gas, so as to form an aluminum oxide layer; and
   controlling excess arsenic released in the aluminum oxide layer as a result of the oxidizing step;
wherein the controlling step further comprises hydrogenizing the aluminum oxide layer by exposing the aluminum oxide layer to hydrogen ions.

11. A method of manufacturing a gallium arsenide field effect transistor having a gallium arsenide channel layer, a source and a drain, comprising the steps of:
   depositing an aluminum arsenide layer over the gallium arsenide channel layer;
   laterally oxidizing the aluminum arsenide layer by exposing the aluminum arsenide layer to an oxidizing gas, so as to form an aluminum oxide layer; and
   controlling excess arsenic released in the aluminum oxide layer as a result of the oxidizing step:
wherein the controlling step further comprises depositing an n-type layer over the layer of aluminum arsenide.

12. The method of claim 11, wherein the n-type layer is formed from the group consisting of gallium arsenide, aluminum gallium arsenide, gallium nitride, aluminum gallium indium phosphide, and indium phosphide.

13. A method of manufacturing a gallium arsenide field effect transistor having a gallium arsenide channel layer, a source and a drain, comprising the steps of:
   depositing an aluminum arsenide layer over the gallium arsenide channel layer;
   laterally oxidizing the aluminum arsenide layer by exposing the aluminum arsenide layer to an oxidizing gas, so as to form an aluminum oxide layer; and
   controlling excess arsenic released in the aluminum oxide layer as a result of the oxidizing step:
   wherein the controlling step further comprises depositing a vacancy semiconductor layer over the layer of aluminum arsenide, the vacancy semiconductor layer having vacancies so as to attract the excess arsenic from the oxide layer.

14. The method of claim 13, wherein the vacancy semiconductor layer is a low temperature growth layer of gallium arsenide, indium gallium arsenide, and indium phosphide.

15. A method of manufacturing a gallium arsenide field effect transistor having a gallium arsenide channel layer, a source and a drain, comprising the steps of:

depositing an aluminum arsenide layer over the gallium arsenide channel layer;

laterally oxidizing the aluminum arsenide layer by exposing the aluminum arsenide layer to an oxidizing gas, so as to form an aluminum oxide layer; and controlling excess arsenic released in the aluminum oxide layer as a result of the oxidizing step;

wherein the controlling step further comprises forming a semiconductor barrier layer between the gallium arsenide layer and the aluminum arsenide layer.

16. The method of claim 15, wherein the semiconductor barrier layer is formed from the group consisting of aluminum gallium arsenide, indium gallium phosphide, gallium nitride, aluminum gallium indium phosphide, and indium phosphide.

17. A method of manufacturing a gallium arsenide complementary metal-insulator-semiconductor device, having an n-type gallium arsenide channel layer, a first source and a first drain on a substrate; and a p-type gallium arsenide layer, a second source and a second drain on the substrate, the method comprising:

depositing an aluminum arsenide layer over the n-type and p-type gallium arsenide channel layers; and laterally oxidizing the aluminum arsenide layer by exposing the aluminum arsenide layer to an oxidizing gas, so as to form an aluminum oxide layer.

18. The method of claim 17, further comprising the step of controlling excess arsenic released in the aluminum oxide layer as a result of the oxidizing step.

19. The method of claim 18, wherein the controlling step comprises hydrogenizing the aluminum oxide layer by exposing the aluminum oxide layer to hydrogen ions.

20. The method of claim 18, wherein the controlling step comprises depositing an n-type layer over the layer of aluminum arsenide.

21. The method of claim 20, wherein the n-type layer is formed from the group consisting of gallium arsenide, aluminum gallium arsenide, gallium nitride, aluminum gallium indium phosphide, and indium phosphide.

22. The method of claim 18, wherein the controlling step comprises depositing a vacancy semiconductor layer over the layer of aluminum arsenide, the vacancy semiconductor layer having vacancies so as to attract the excess arsenic from the oxide layer.

23. The method of claim 22, wherein the controlling step comprises forming a semiconductor barrier layer between the n-type and p-type gallium arsenide channel layers and the aluminum arsenide layer.

24. The method of claim 23 wherein the semiconductor barrier layer is formed from the group consisting of aluminum gallium arsenide and indium gallium phosphide.

25. The method of claim 18, comprising the further step of etching the aluminum arsenide layer to form a first region of aluminum arsenide to be oxidized, to become a first gate aluminum oxide layer overlying the n-type gallium arsenide channel layer, and to form a second region of aluminum arsenide to be oxidized, to become a second aluminum oxide layer overlying the p-type gallium arsenide channel layer.

* * * * *

UNITED STATES PATENT AND TRADEMARK OFFICE
CERTIFICATE OF CORRECTION

PATENT NO. : 5,872,031
DATED : February 16, 1999
INVENTOR(S) : Umesh K. Mishra and Primit A. Parikh It is certified that error appears in the above-identified patent and that said Letters Patent is hereby corrected as shown below:

Column 1,
Line 19, "now abandoned" should read -- now U.S. Pat. No. 5,798,555 --.

Signed and Sealed this

Thirty-first Day of July, 2001

Attest:

*Attesting Officer*

NICHOLAS P. GODICI
*Acting Director of the United States Patent and Trademark Office*